(12) United States Patent
Ay

(10) Patent No.: US 7,247,831 B1
(45) Date of Patent: Jul. 24, 2007

(54) REDUCTION IN SIZE OF COLUMN SAMPLE AND HOLD CIRCUITRY IN A CMOS IMAGER

(75) Inventor: Suat Utku Ay, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/494,359

(22) Filed: Jul. 25, 2006

(51) Int. Cl.
*H04N 5/335* (2006.01)

(52) U.S. Cl. ................................. 250/208.1; 348/308
(58) Field of Classification Search ............. 250/208.1; 348/301, 308
See application file for complete search history.

(56) References Cited

U.S. PATENT DOCUMENTS

2006/0007338 A1* 1/2006 Wakano et al. ............ 348/308
2006/0164531 A1* 7/2006 Yaung et al. ............... 348/308

OTHER PUBLICATIONS http://www.olympusmicro.com/primer/digitalimaging/cmosimage-sensors.html, publication date unknown, copy downloaded Jun. 8, 2006.

\* cited by examiner

*Primary Examiner*—John R. Lee
(74) *Attorney, Agent, or Firm*—Wong Cabello L.L.P.

(57) ABSTRACT

Improved column sample-and-hold (CSH) circuitry particularly useful in a CMOS imager is disclosed. In the improved circuitry layout, the overall column height of the CSH circuitry is reduced by providing a plurality of pairs of sampling and reference capacitors in a vertical stack over the columns that the capacitors service. The number of pairs provided in the vertical stack is subject to optimization, and for a given set of design constraints, a certain form factors can prove to be optimal. No modification needs to be made to the pixel array (such as pixel pitch), and the sensing circuitry otherwise requires no electrical or process modifications as the values for the capacitances as well as other design constraint are preserved. However, the vertical stacking of the plurality of pairs of capacitors reduces the overall column height (CH), which conserves layout space on the CMOS imager integrated circuit.

22 Claims, 8 Drawing Sheets

REDUCTION IN SIZE OF COLUMN SAMPLE AND HOLD CIRCUITRY IN A CMOS IMAGER

CROSS-REFERENCE TO RELATED APPLICATIONS

This application is related to U.S. patent application Ser. No. 11/494,351, entitled "Improved Sensing Capacitance in Column Sample and Hold Circuitry in a CMOS Imager," which is filed herewith, and which is incorporated by reference in its entirety.

FIELD OF THE INVENTION

Embodiments of the invention relate to reducing the layout size of the capacitors in the column sample-and-hold circuitry in a CMOS imager.

BACKGROUND

Complementary Metal-Oxide-Semiconductor (CMOS) imagers are gaining popularity in the market place. As one skilled in the art understands, CMOS imagers are used to sense light and to provide an electronic representation of the sensed imaged. Accordingly, such devices are useable in digital cameras, to cite just one example.

FIG. 1 shows an example of the basic architecture of a CMOS imager 10 integrated circuit. As can be seen, the CMOS imager 10 includes an array 12 of photosensitive pixels 8 arranged in rows and columns. Read out of a given pixel 8 requires the activation of a given row and column, which is the function of the row decoder circuitry 14 and the column decoder circuitry 16, which in turn are responsive to a row address and column address input into the imager 10. The accessed pixel 8 routes a photo-induced charge from the pixel 8 to its associated column, which meets with column sample-and-hold (CSH) circuitry 18. In FIG. 1, the CSH circuitry 18 is shown at the bottom edge of the pixel array 12 (a bottom-only architecture), although it may also appear at the top and bottom of the array 12 as will be discussed further below. Briefly, the CSH circuit 18 samples the accessed pixel's charge via a sampling capacitor and a reference capacitor (more on this below) to produce signals "sig" and "rst," which are input to an amplifier 20. The amplifier 20 in turn produces analog signals indicative of the sensed charge, and provides them to an analog-to-digital Converter (ADC) circuit 22 to provide a digital representation of the intensity of the light impingent on the pixel 8 being read.

FIG. 2 shows further details of the pixel array 12 and of the sensing circuitry, and in particular the CSH circuitry 18. As can be seen, each pixel 8 comprises a photodiode 11, which induces a charge which scales in magnitude with the intensity of the light impingent upon the photodiode. This induced charge drives a transfer gate 13 to route some amount of the power supply voltage Vcc onto a given column 15, assuming that the access transistor 17 for the row of the pixel 8 in question has been activated by the row decoders 14. Although not shown, one skilled in the art will realize that each pixel 8 may comprise a reset transistor as well.

The pixel induced charge is thus routed from the column 15 to the CSH circuitry 18, where it is coupled to two capacitors, called the sampling capacitor, Cs 32, and the reference capacitor, Cr 33. As each column has its own dedicated sampling and reference capacitors 32 and 33, they are denoted in conjunction with the column they support: i.e., the capacitors for column 0 are denoted as C0s and C0r. While the actual mechanics for using the sensing and reference capacitors 32 and 33 to sense the induced charge on the pixels 8 are well known and not directly important to embodiments of the invention, it is only briefly explained here. Essentially, a sample signal ("samp_sig") is sent from the imager 10's control unit (not shown) to close one of transistors 19 move the charge from the column 15 onto the sampling capacitor 32 Cxs. Later in the sensing cycle, the other of the transistors 19 is opened to move charge from the column 15 to the reference capacitor 33 Cxr, which occurs in conjunction with resetting of the pixel. This provides a reference level of charge which is essentially used to normalize the signal charge. The sampled charge on Cxs and the reference charge Cxr are then passed by transistors 21 under control of a column decoder 16 at an appropriate time onto signal lines "sig" and "rst," which are in turn passed to the amplifier 20 to perform the normalization, and ultimately to the ADC 22 where the magnitude of normalized sensed change is digitized.

Further details concerning the design and operation of CMOS imagers can be found at http://www.olympusmicro-.com/primer/digitalimaging/cmosimagesensors.html, a copy of which is submitted in an Information Disclosure Statement filed with this application, and which is hereby incorporated by reference in its entirety.

FIG. 3 shows a typical layout of the sampling and reference capacitors 32 and 33 in conjunction with the pixel array 12. In the embodiment shown, the capacitors 32 and 33 are positioned on both the top and bottom of the array 12 (a top-bottom architecture). So arranged, the top sets of capacitors 32t and 33t service the even-numbered columns, while the bottom sets of capacitors 32b and 33b service the odd-numbered columns. The columns 15 are not shown for ease of illustration.

The sensing and reference capacitors 32 and 33 in this embodiment are formed from two different layers of polycrystalline silicon ("poly 2" over "poly 1"), with the poly 1 plate formed with a slightly larger area to allow contact to be easily made from overlying metal layers (e.g., the columns 15; not shown) to the bottom capacitor plate. (Note that this sizing difference between the poly 1 and poly 2 plates of the capacitors 32 and 33 is in reality quite small, and that the difference is greatly exaggerated in the Figures). As one skilled in the art of semiconductor processing will understand, a dielectric layer (such as a silicon oxide or silicon nitride) intervenes between the two capacitor plates.

Although the layout of FIG. 3 is not drawn to scale, one of skill in the art will appreciate that the CSH circuitry 18 takes up significant layout space on the imager integrated circuit. This is primarily due to the size of the sampling and reference capacitors 32 and 33. For proper sensing, it is simply the case that the capacitance of these capacitors needs to be quite large (perhaps 1.2 pF a piece). As a result, these capacitors 32 and 33 are made large in area to maximize their capacitance. Thus, even when the sampling and reference capacitors 32 and 33 are split between the top and bottom of the array 12 as shown in FIG. 3, the result is that the CSH circuitry 18 is quite long, what is referred to herein as the "column height" (CH) of the CSH circuitry 18. As can be seen in FIG. 3, this column height CH is dominated by the height h of each of the sampling and reference capacitors 32 and 33. Moreover, further adding to the column height are smaller spaces of dimension d, what is referred to herein as the intercapacitor spacing. These spaces d perform the function of isolating the capacitors 32 and 33, and is usually set as a design constraint. Additionally, the intercapacitor spacing d can also provide the location of other circuitry used within the CSH circuitry 18, such as the selection and column decode transistors 19 and 21 (FIG. 2).

In any event, the column height of the CSH circuitry 18 in CMOS imagers is a significant issue, and reduction of the height is greatly desired. Without schemes to reduce this height, further miniaturization of these devices (which ultimately increases their profitability) will become increasing difficult.

BRIEF DESCRIPTION OF THE DRAWINGS

Embodiments of the inventive aspects of this disclosure will be best understood with reference to the following detailed description, when read in conjunction with the accompanying drawings, in which:

FIG. 4A illustrate the layout of FIG. 3 in further detail, while FIGS. 4B and 4C illustrate examples of the improved layout for sampling and reference capacitors in CSH circuitry for different form factors in accordance with embodiments of the invention, with the improved circuitry showing a significant reduction in the column height.

DETAILED DESCRIPTION

Improved column sample-and-hold (CSH) circuitry particularly useful in a CMOS imager is disclosed. In the improved circuitry layout, the overall column height of the CSH circuitry is reduced by providing a plurality of pairs of sampling and reference capacitors in a vertical stack over the columns that the capacitors service. For example, above columns 0 and 2 in the array (assuming a top-bottom CSH architecture) reside the sampling capacitors for columns 0 and 2 and the reference capacitors for columns 0 and 2, for a total of 4 capacitors arranged vertically over those columns. (In a top-bottom CSH architecture, the odd-numbered columns 1 and 3 would likewise be serviced by two sampling and two reference capacitors at the bottom of the columns). Or, depending on optimization of the form factor, greater numbers of pairs of vertically-stacked capacitors can be used, such as six (servicing three columns) or eight (servicing four columns). In such modified and improved configurations, the intercapacitor spacing d and intercolumn spacings cs are preserved, as is the overall size of the capacitors. Therefore, no modification needs to be made to the pixel array (such as pixel pitch), and the sensing circuitry otherwise requires no electrical or process modifications as the values for the capacitances are preserved. However, the vertical stacking of the plurality of pairs of capacitors reduces the overall column height (CH). In short, through use of embodiments of the invention, layout space is conversed on the CMOS imager integrated circuit.

Figure 3:
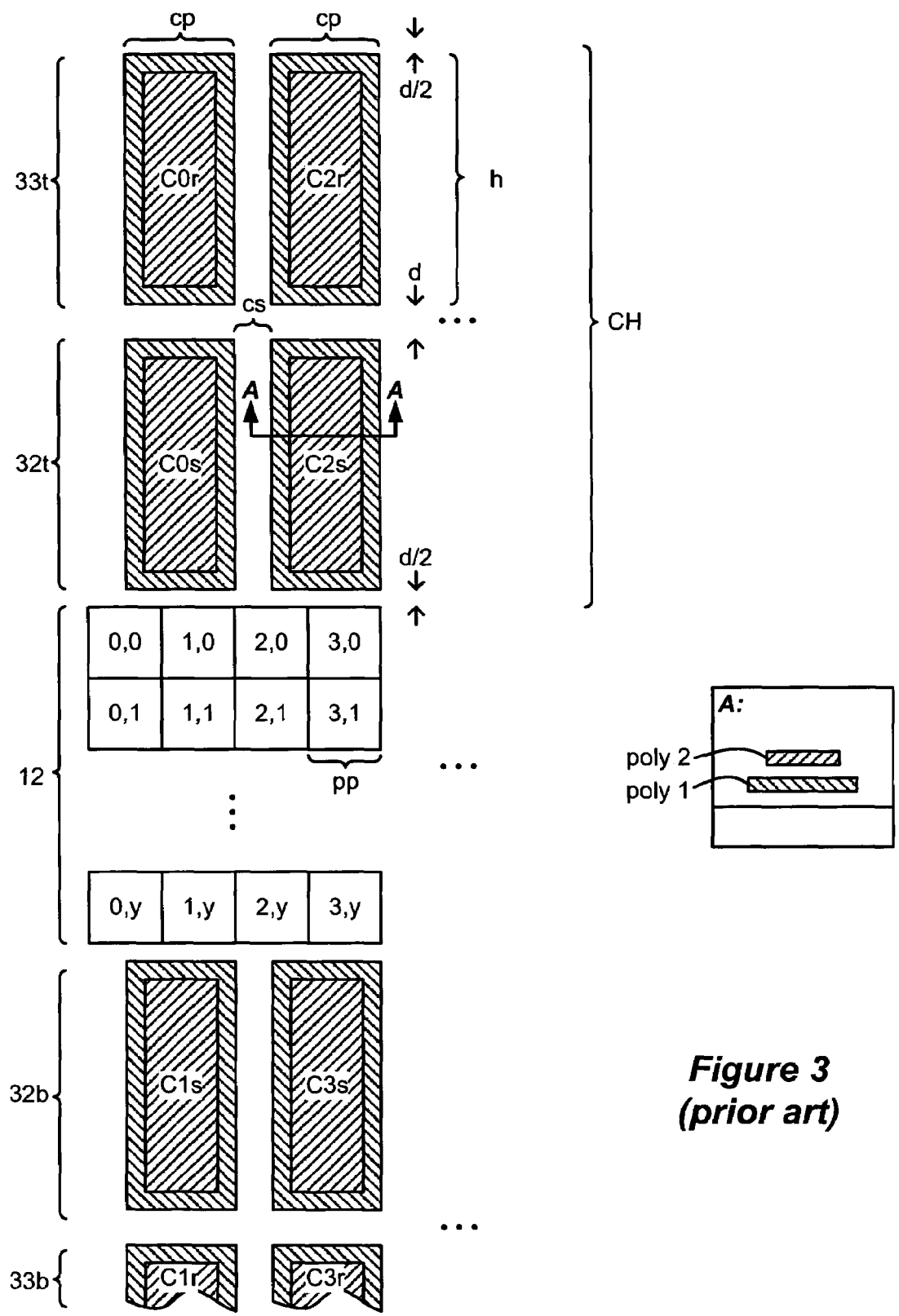
FIG. 3 illustrates the layout of the sampling and reference capacitors in the CSH circuit in accordance with the prior art.
Figure 4:
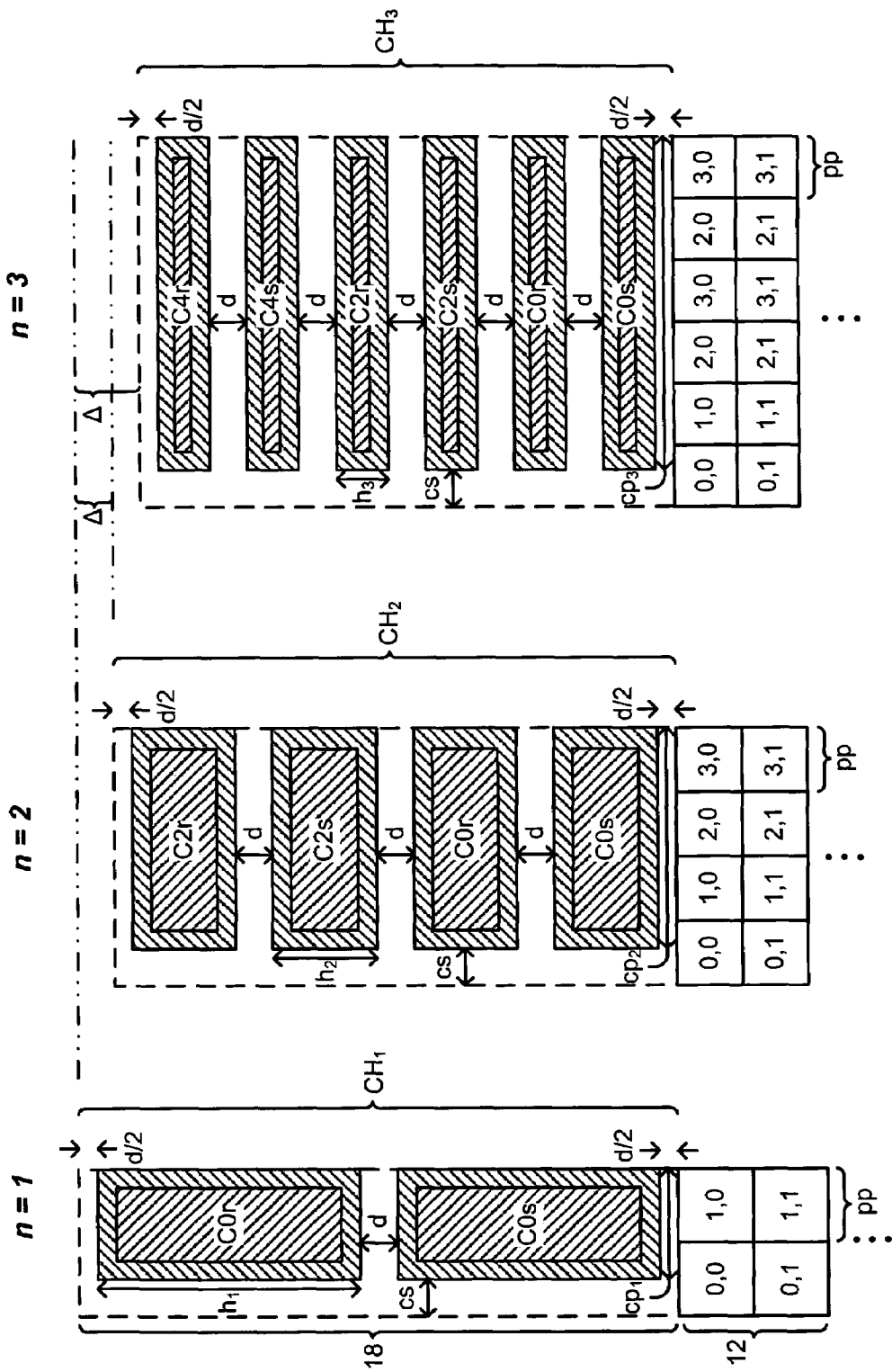

FIGS. 4A through 4C illustrate how the improved layout for the CSH circuitry 18 reduces the column height (CH) of the CSH circuitry 18 FIG. 4A illustrates in further detail the prior art approach set forth in FIG. 3. As shown, a sampling capacitor 32 C0s and a reference capacitor 33 C0r are vertically stacked. Because a top-bottom CSH circuitry architecture is employed, the illustrated capacitors in FIG. 4A service column 0 (i.e., pixels 0,0; 0,1; 0,2; . . . 0,y); column 1 (and all other odd-numbered columns) would in turn be serviced by similar capacitors (C1s, Cr1) located at the bottom of the array 12 (not shown). Because the a single pair of capacitors C0s and C0r is used, this design is said to have a CSH form factor n equal to one.

As discussed earlier, the capacitors C0s and C0r are vertically spaced from each other by an intercapacitor spacing d, which can be half that value (d/2) at the top and bottom of the CSH circuitry. Also, the capacitors are horizontally spaced from each other by intercolumn spacing cs. Assume per design rules that the pixel pitch pp, intercapacitor spacing d, and intercolumn spacing cs are fixed. Assume further that the capacitors are equal and in sum ($C_{tot}$) must be of a particular capacitance value for proper sensing (such as 1.2 pF a piece). Also assume that the inherent capacitance-per-area of the materials is set for the capacitors (as dictated by the dielectric constant of the dielectric between the poly 1 and poly 2 plate, and the thickness of that dielectric) at a value $C_{unit}$ (expressed, for example in fF/micron$^2$). Given these realistic design constraints, it is noticed that the width of the capacitors must be fixed to a value of $cp_1$, or 2*pp-cs. Therefore, to achieve the appropriate capacitance given all of the other design constraints, the height of the capacitors $h_1$ (the only remaining variable) must be adjusted to an appropriate length. However, as noted in the background, this yield a total column height ($CH_1$) for the CSH circuitry 18 that is quite long, and which takes up significant layout space on the imager integrated circuit.

However, when the sampling and reference capacitors pairs are vertically stacked, as shown in FIGS. 4B and 4C, the column height CH is improved. These Figures respectively illustrate CSH form factors of n=2 and n=3. Thus, in FIG. 4B, two pairs of capacitors—C0s/C0r and Cs2/C2r—are vertically stacked and service columns 0 and 2. (Odd-numbered columns 1 and 3 would in this example be serviced by two similar pairs of vertically-stacked capacitors C1s/C1r and C3s/C3r on the bottom side of the array). FIG. 4C is similar, but has a form factor n=3; thus three vertically-stacked pairs of capacitors—C0s/C0r, Cs2/C2r, and C4s/C4r—are used to service three columns 0, 2, and 4. (Again, columns 1, 3, and 5 would be serviced by three similar pairs of vertically stacked capacitors on the bottom side of the array).

Notice that the improved layouts of FIGS. 4B and 4C achieve a significantly smaller overall column height: $CH_2$ is smaller than $CH_1$ by Δ, and $CH_3$ is still even smaller that $CH_1$ by Δ'. Essentially, this height reduction arises by virtue of savings provided by the integration of the intercolumn spacing cs at higher form factors n. Thus, in FIG. 4B, where n=2, notice that the improved layout only requires the provision of one intercolumn spacing cs. By contrast, to service two columns, two intercolumn spacings would be required in the prior art. By effectively modifying the layout to integrate the intercolumn spacings into a single intercolumn spacing for all form factors n, column height savings can result. The overall effect is a more compact CSH circuitry 18 layout, allowing for the fabrication of a smaller imager integrated circuit and its associated benefits (improved yield, lower manufacturing costs, etc.).

Moreover, the optimal form factor n for a given set of design constraint can be easily derived. In this regard, mathematics can be employed. For example, note that the column height, CH, can be generally expressed for all form factors n as follows:

$$CH_n = 2n^*(h_n + d) \qquad \text{(Eq. 1)}$$

Likewise, the column pitch cp can also be generally expressed as:

$$cp_n = (2n^*pp) - cs \qquad \text{(Eq. 2)}$$

where pp equals the pixel pitch. The area for each capacitor comprises its height $h_n$ times its width $cp_n$, and thus the total area of all capacitors ($A_{tot}$) in the vertical stack equals this single-capacitor area value times 2 (one each for the sampling capacitor and the reference capacitor) times n:

$$A_{tot} = 2n^*h_n{}^*cp_n = 2n^*h_n{}^*[(2n^*pp) - cs] \qquad \text{(Eq. 3)}$$

However, $A_{tot}$ also equals the total capacitance of all of the capacitors $C_{tot}$ divided by the unit capacitance $C_{unit}$. In other words:

$$C_{tot}/C_{unit} = 2n^*h_n{}^*[(2n^*pp) - cs] \qquad \text{(Eq. 4)}$$

This Equation 4 can be solved for $h_n$:

$$h_n = C_{tot}/(C_{unit}{}^*2n^*[(2n^*pp) - cs]) \qquad \text{(Eq. 5)}$$

When Equation 5 is plugged into Equation 1, the column height $CH_n$ is expressable as a function of the form factor n, and as a function of otherwise constant and known design constraints ($C_{tot}$, $C_{unit}$, pp, cs, and d):

$$CH_n = [C_{tot}/(C_{unit}{}^*[(2n^*pp) - cs])] + 2n^*d \qquad \text{(Eq. 6)}$$

In other words, per Equation 6, the column height is expressable without consideration of the height or width of the individual capacitors ($h_n$, $cp_n$) in the vertical stack, although of course these widths and heights can be readily calculated using the above formulas once the optimal form factor n is chosen.

With the column height, $CH_n$, derived as a function of the form factor n, the column height may now be plotted as a function of n to determine which n will yield the smallest value for $CH_n$, and hence the most optimal and compact design. Such results are plotted in FIG. 5 for a given set of design constraints ($C_{tot}$, $C_{unit}$, pp, cs) and for three values for the intercapacitor spacing d. For the design constraints chosen, notice that all of the graphs exhibit a minimum, suggesting a most optimal form factor n. Thus, for any of the three depicted values for d, a form factor of n=3 is optimal (such as is illustrated in FIG. 4C), although for the smallest d value, a form factor of n=4 appears equally optimal.

The minimum optimal point in these graphs can be explained generally as follows. As the form factor n increases, the column height decreases due to the benefit of integration of the intercolumn spacings cs, as discussed earlier. However, as the form factor increases, and more and more capacitors become vertically stacked, eventually the intercapacitor spacing d (which also increases with an increasing number of capacitors) will start to dominate and reduce the efficiency of the layout. In other words, at higher form factors, eventually the requirement of a fixed number of intercapacitor spacings d will cause the overall column height $CH_n$ to increase. Indeed, this increase in height is more pronounced as the value of d increases, and as FIG. 5 illustrates.

Figure 5:
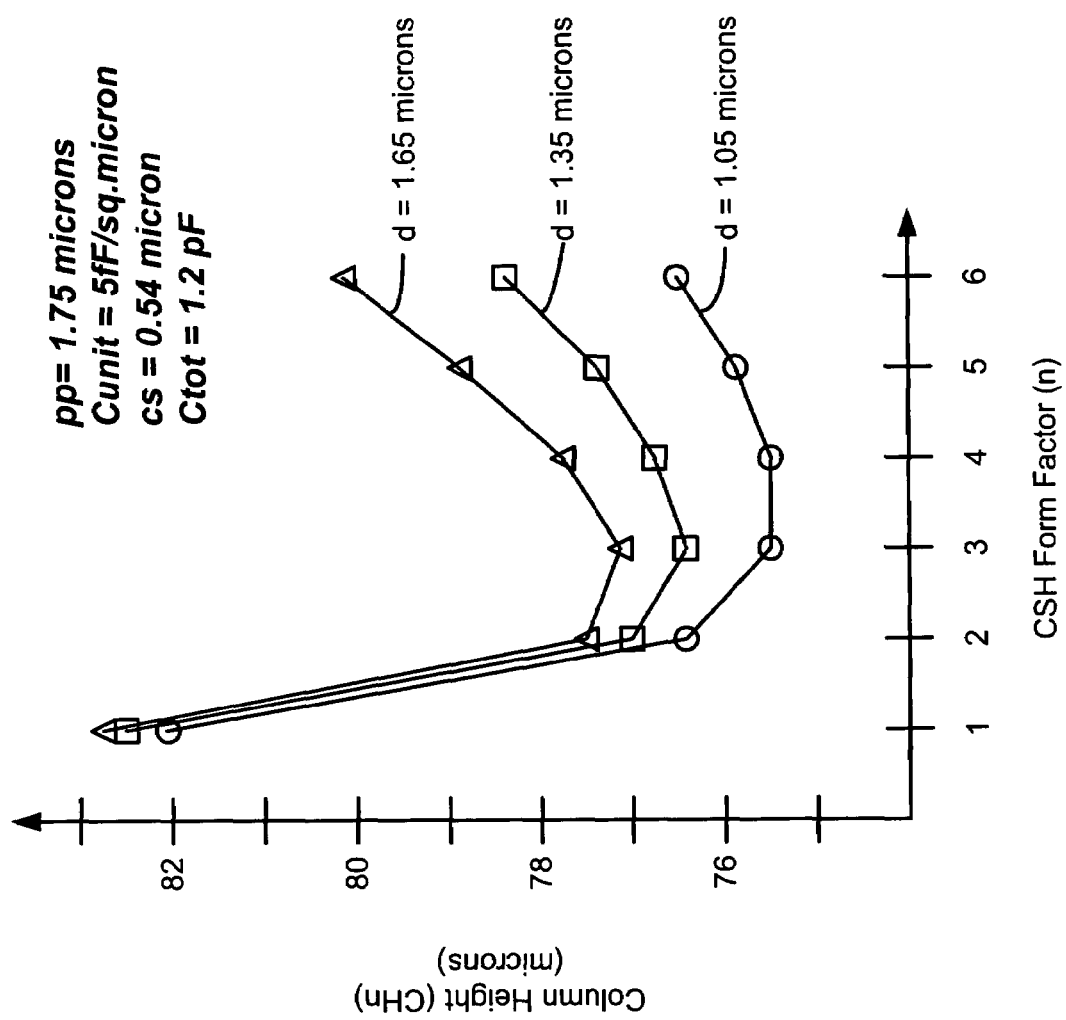
FIG. 5 illustrates the saving in column height in accordance with embodiments of the invention illustrated as a function of the form factor.

While simple plotting or simulation of the sort depicted in FIG. 5 can assist in the determination of an optimal form factor n for the CSH circuitry 18, calculus can also be used to quantitatively determine an optimal value. Thus, the derivative of the column height, $CH_n$, as expressed above in Equation 6, can be taken with respect to n, i.e., $dCH_n/d_n$. That derivative can then be set to 0, and the resulting equation can be solved for n to determine the minimum of $CH_n$, and hence the optimal form factor (i.e., solve for n when $dCH_n/d_n = 0$). As such mathematical calculations are within the knowledge of one skilled in the art, they are not set forth here. In any event, the salient point is that the optimal form factor can be quantitatively determined with mathematical certainty. Obviously, a computer can be of great assistance in making such calculations, and such computer can comprise the same computer or system that is used by a designer to layout the CSH circuitry 18 and other related aspects of the CMOS imager 10.

Figure 1:
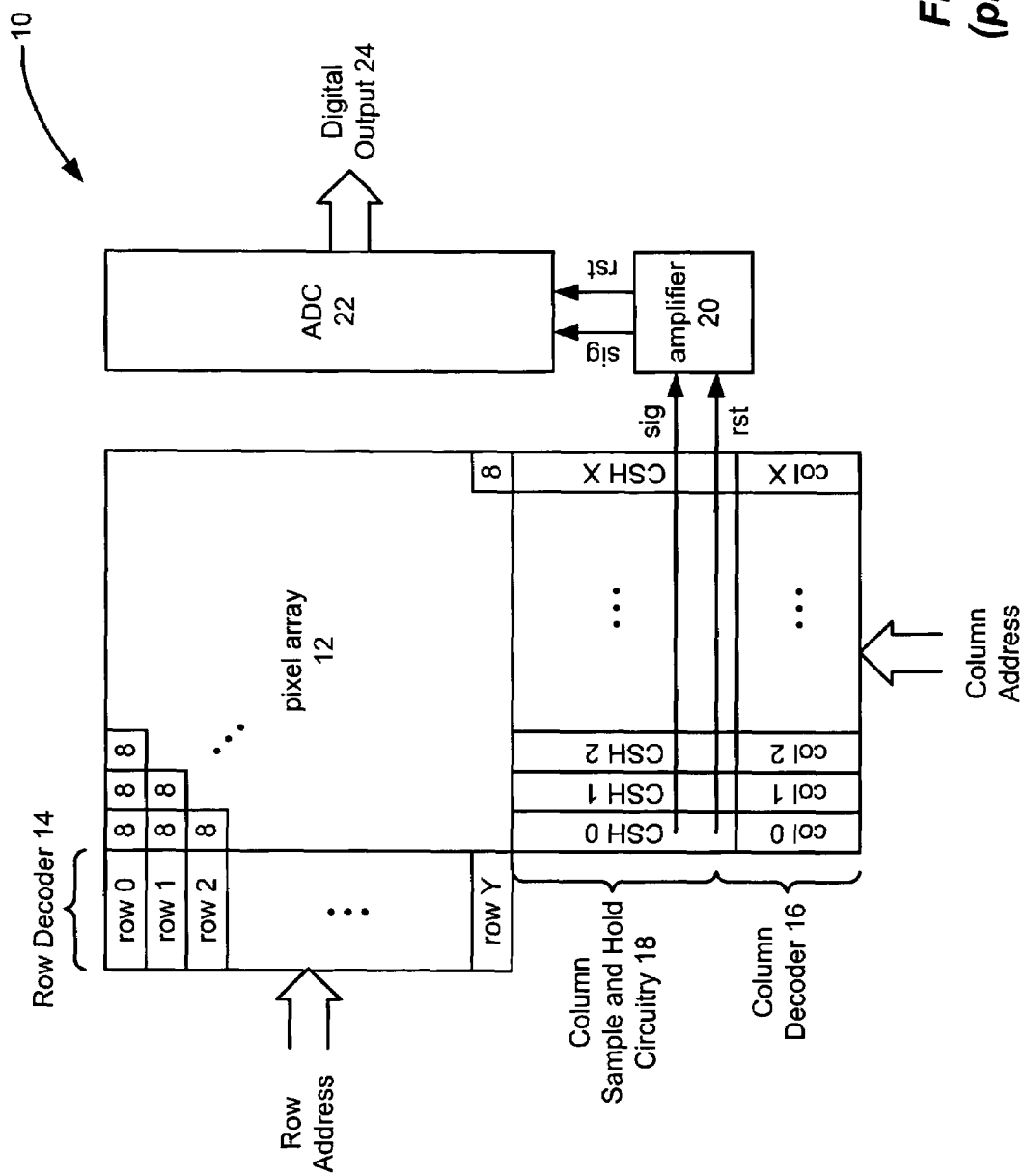
FIG. 1 illustrates the basic circuit blocks in a CMOS imager integrated circuit.
Figure 6:
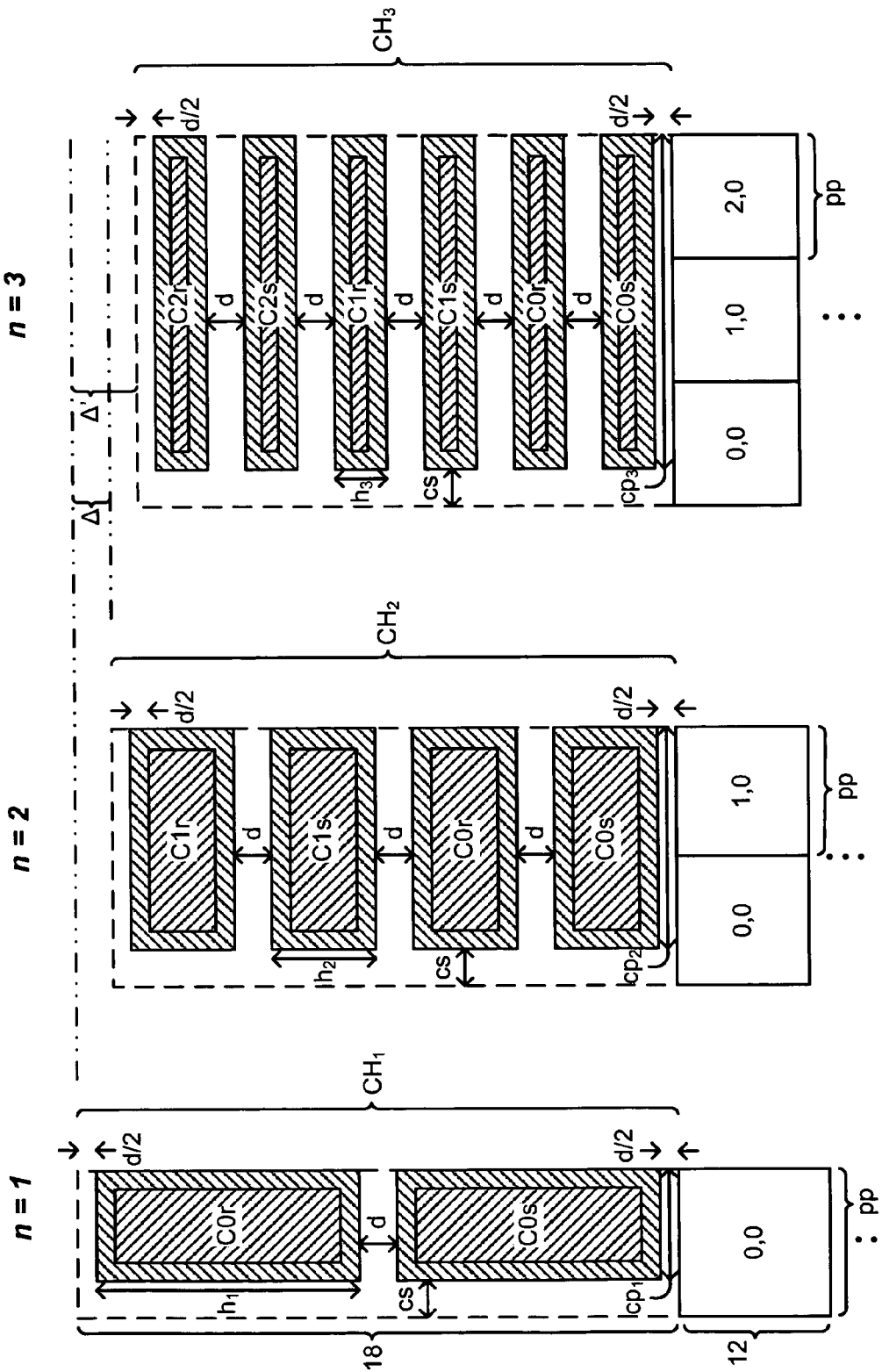
FIGS. 6A-6C are analogous to FIGS. 4A-4C, and illustrate the applicability of embodiments of the invention to top- or bottom-only CSH architectures.

Although described in the context of a top-bottom CSH architecture in which CSH circuitry 18 is provided at the top and bottom of the array 12, it should be noted that embodiments of the invention are equally applicable to top- or bottom-only CSH circuitry architecture, such as is shown in FIG. 1. An example implementing the improved CSH circuitry layout in a top-only architecture is shown in FIGS. 6A-6C. FIGS. 6A-6C are analogous to FIGS. 4A-4C, except that the CSH circuitry 18 appear only at the top of the array 12, and thus, each sampling capacitor 32 and reference capacitor 33 pair service all of the columns that appears beneath them. Thus, in FIG. 6A, depicting a form factor of n=1, only the single column (column 0) being served appears below the single capacitor pair (C0s/C0r); in FIG. 6B, depicting a form factor of n=2, only the two columns (columns 0 and 1) being serviced by the two pairs of capacitors (C0s/C0r and C1s/C1r) reside below those capacitors; etc. In any event, the important point is that the same layout improvements are realized in this top- (or bottom-) only embodiment, although the math changes slightly to account for the smaller number of pixels (or columns) involved. If one proceeds through the same mathematics as outline above for the top-bottom CSH circuitry configuration of FIG. 4, the column height, $CH_n$, for the top- or bottom-only embodiment can again be calculated:

$$CH_n = [C_{tot}/(C_{unit}{}^*[(n^*pp) - cs])] + 2n^*d \qquad \text{(Eq. 7)}$$

From this equation, form factor optimization for the top- or bottom-only architecture is easily accomplished as outlined above. In short, embodiments of the invention are equally useful in a top- or bottom-only CSH circuitry architecture, such as is shown in FIG. 1.

Figure 2:
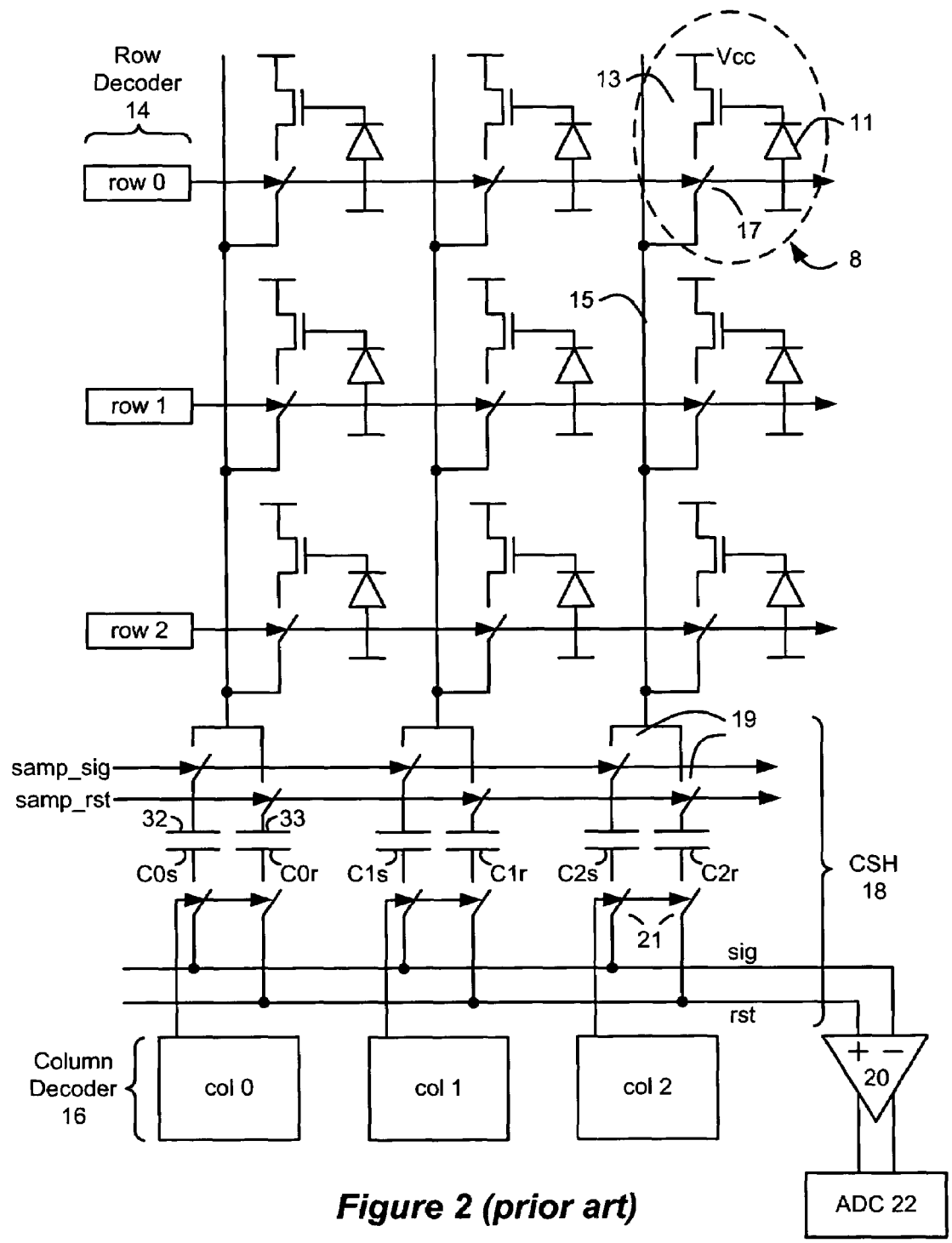
FIG. 2 illustrates the circuit schematic for the pixel array and column sample and hold (CSH) circuitry for the CMOS imager of FIG. 1.

Although not shown in the Figures for clarity, one skilled in the art will understand that many different ways exist to couple the columns 15 (see FIG. 2) to the improved layout for the sampling and reference capacitors as disclosed herein. Briefly, the columns 15 can be laid out on in the array in a metal layer (e.g., metal 1, metal 2) as is typical. Because the capacitors are preferably form in lower-lying poly levels, the columns can easily be directly routed to the appropriate capacitors plates in the vertical stack using the same level of metal as the columns. Of course, it is also necessary to fabricate and layout various transistors (e.g., 19, 21 of FIG. 2) to complete the CSH circuitry 18, but this can occur in traditional locations without adversely affecting (or being affected by) the improved layout for the capacitors. In short, even though the capacitor pairs are vertically stacked in the improved CSH circuitry layout disclosed herein, no significant new layout considerations are presented, further facilitating implementation.

In short, the improved CSH circuitry layout as disclosed herein provide significant layout space reduction, is easily optimized in terms of its form factor for a given set of design constraints, and otherwise require no significant modifications to the layout or the process used to fabricate the CMOS imager 10.

Figure 7:
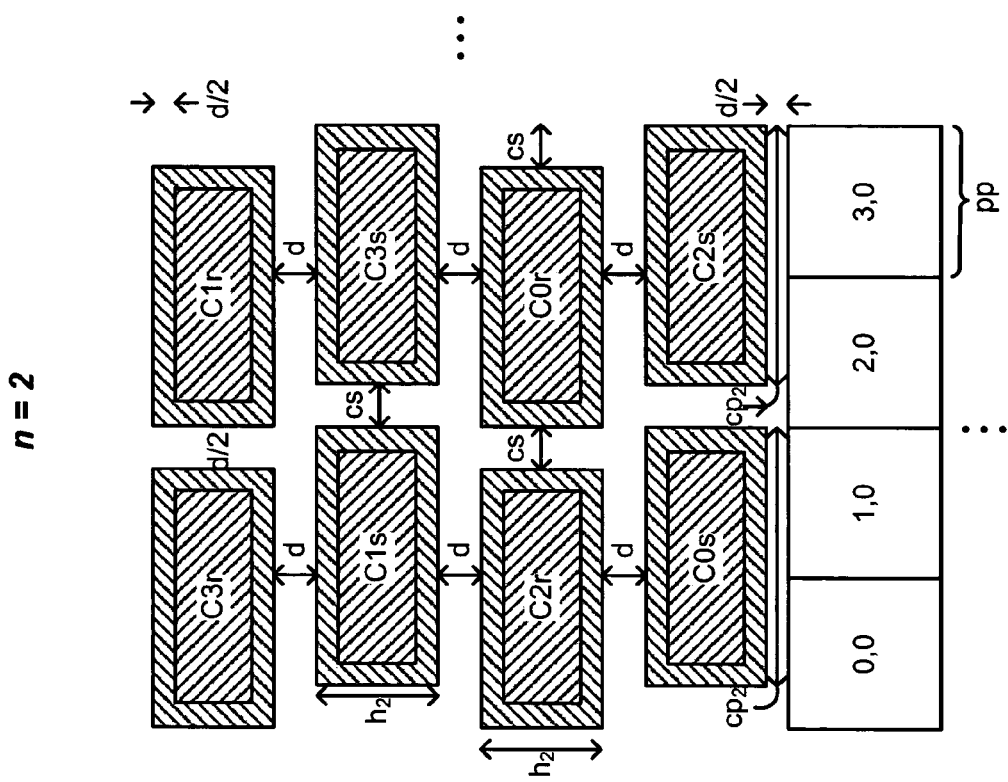
FIG. 7 illustrates another manner in which the plurality of pairs of capacitors may be vertically stacked.

While a preferred embodiment of the invention has been disclosed, it should be understood the embodiments as disclosed herein can be modified while still achieving the various advantages discussed herein. For example, while it has been suggested that an implementation of the invention involves the use of a plurality of pairs of vertically-stacked capacitors in the CSH circuitry, it should be understood that such vertical stacking does not require the sacked pairs to appear in a perfectly straight line. For example, and referring to FIG. 7, illustrating a modification of the top-only, n=2 configuration of FIG. 6B, the capacitors in each pair have been staggered slightly while still preserving the intercolumn cs and intercapacitor d spacing. Even though these capacitors are not arranged in a perfectly straight vertical line, they are still generally "vertically stacked" for purpose of this disclosure. For purposes of this disclosure, "vertical stacking" means does not imply that the capacitors are stacked in the dimension out of the plane of the integrated circuit.

Figure 8:
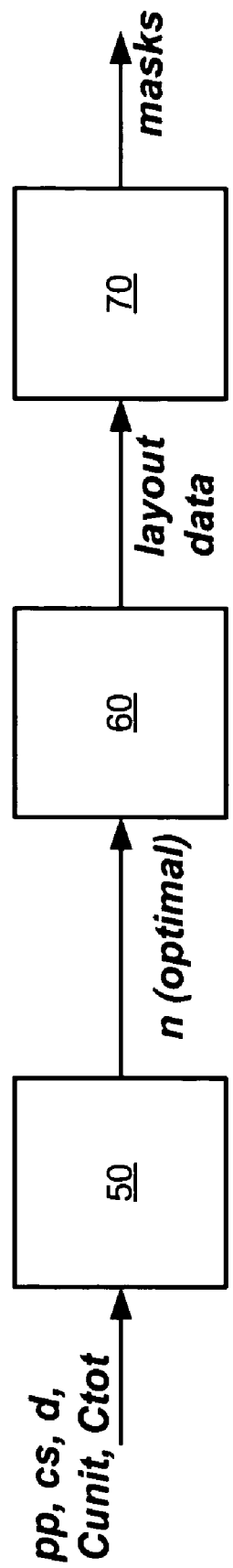
FIG. 8 illustrates a computer system for implementing embodiments of the invention.

As mentioned earlier, optimization of the form factor n and design and layout of the CSH circuitry can be accomplished in automated or semi-automated fashion using a computer or computer system. This is briefly illustrated in FIG. 8. As shown, the design constraints relevant to the design of the sampling and reference capacitors in the CSH circuitry 18 (e.g., pp, cs, d, $C_{unit}$, $C_{tot}$) are entered into a computer 50, for example, by an imager circuit designer. Computer 50 can then processing these design constraints to determine an optimal form factor n that minimizes the column height of the sample and hold circuit. Such processing and optimization by the computer can take the form of deriving the formula for the column height CHn (such as Equations 6 or 7), and then optimizing n by graphing (e.g., FIG. 5) or by the use of mathematics as discussed above, or by other iterative means involving raw computational brute force, trial and error, etc. Indeed, it should be noted that this optimization process may not always dictate that the optimal form factor will be two or greater. For a given set of design constraints, the optimization and deign process may show that a form factor of n=1 is optimal, such as is shown in FIGS. 4A and 6A. Of course, computer 50 may not be need, as the optimal form factor may also be determinable "on paper."

Either way, the result of the processing yield an optimal n, which in turn is used to create a layout of the CSH circuitry 18 on a computer 60. As is well understood in the industry, computer 60 allows the designer to actually create and view the layout, and may also include software tools to assist with automatic layout of structure in accordance with design rule (or in accordance with the pre-determined optimal n value). The result is the outputting of layout data that is used in the fabrication of masks used to fabricate the imager integrated circuit. The masks may ultimately be generated by another automated computer 70 associated with a mask generating machine. One skilled in the art will understand that the computers 50, 60, and 70 illustrated in FIG. 8 may be wholly or partially integrated, and accordingly a "computer" as used herein should be understood as including separate non-integrated computers, integrated computers, or a computer system.

It should be understood that the inventive concepts disclosed herein are capable of many modifications. To the extent such modifications fall within the scope of the appended claims and their equivalents, they are intended to be covered by this patent.

What is claimed is:

1. An imager integrated circuit, comprising:
   an array of pixels arranged in a plurality of columns and rows;
   a plurality of sensing circuits at least a top of the array, wherein each sensing circuit comprises a plurality of pairs of sensing and reference capacitors, wherein the plurality of pairs of sensing and reference capacitors in each sensing circuit are vertically stacked above a plurality of columns each pair services in a direction parallel to the plurality of columns.

2. The imager integrated circuit of claim 1, wherein the plurality of sensing circuits are additionally at a bottom of the array.

3. The imager integrated circuit of claim 2, wherein the plurality of the sensing circuits at the top of the array service even-numbered columns in the array, and wherein the plurality of sensing circuits at the bottom of the array service odd-numbered columns in the array.

4. The imager integrated circuit of claim 3, wherein the even- and odd-numbered columns are interleaved in the array.

5. The imager integrated circuit of claim 1, wherein the sensing circuit has a column height, and wherein the number of the plurality of pairs of sensing and reference capacitors is optimal to minimize the column height.

6. The imager integrated circuit of claim 1, wherein the sensing and reference capacitors are of the same size.

7. The imager integrated circuit of claim 1, wherein the sensing and reference capacitors are of the same capacitance.

8. The imager integrated circuit of claim 1, wherein the plurality of pairs of sensing and reference capacitors in each sensing circuit are vertically stacked in a straight line.

9. The imager integrated circuit of claim 1, wherein the plurality of pairs of sensing and reference capacitors in each sensing circuit lie in the same plane in the integrated circuit.

10. The imager integrated circuit of claim 1, wherein the vertically stacked plurality of pairs of sensing and reference capacitors in each sensing circuit are vertically separated by an intercapacitor spacing.

11. The imager integrated circuit of claim 1, wherein adjacent sensing circuits have their capacitors separated by an intercolumn spacing.

12. An integrated circuit, comprising:
    an array comprised of a plurality of columns and rows;
    a plurality of sensing circuits at least a top of the array, wherein each sensing circuit comprises a plurality of pairs of first and second capacitors, wherein the plurality of pairs of first and second capacitors in each sensing circuit are vertically stacked above a plurality of columns to which they are coupled in a direction parallel to the plurality of columns.

13. The imager integrated circuit of claim 12, wherein the plurality of sensing circuits are additionally at a bottom of the array.

14. The imager integrated circuit of claim 13, wherein the plurality of the sensing circuits at the top of the array service even-numbered columns in the array, and wherein the plurality of sensing circuits at the bottom of the array service odd-numbered columns in the array.

15. The imager integrated circuit of claim 14, wherein the even- and odd-numbered columns are interleaved in the array.

16. The imager integrated circuit of claim 12, wherein the sensing circuit has a column height, and wherein the number of the plurality of pairs of first and second capacitors is optimal to minimize the column height.

17. The imager integrated circuit of claim 12, wherein the first and second capacitors are of the same size.

18. The imager integrated circuit of claim 12, wherein the first and second capacitors are of the same capacitance.

19. The imager integrated circuit of claim 12, wherein the plurality of pairs of first and second capacitors in each sensing circuit are vertically stacked in a straight line.

20. The imager integrated circuit of claim 12, wherein the plurality of pairs of first and second capacitors in each sensing circuit lie in the same plane in the integrated circuit.

21. A method for optimizing a sample and hold circuit for an imager integrated circuit, wherein the sample and hold circuit comprises a plurality of pairs of sampling and reference capacitors vertically stacked over a plurality of array columns served by those pairs in a direction parallel to the columns, the method implementable on a computer, the method comprising:
   entering a plurality of design constraints into the computer relevant to the design of the sampling and reference capacitors in the sample and hold circuit;
   processing the plurality of design constraints using the computer to determine an optimal form factor n, wherein n comprises the number of the plurality of pairs of sampling and reference capacitors vertically stacked over the plurality of array columns served by those pairs, wherein the optimal form factor n comprises a value that minimizes the column height of the sample and hold circuit, wherein the column height comprises a height of the vertical stack of the plurality of pairs of sampling and reference capacitors in a direction parallel to the columns.

22. A method for designing a sample and hold circuit for an imager integrated circuit, wherein the sample and hold circuit comprises a plurality of pairs of sampling and reference capacitors vertically stacked over a plurality of array columns serviced by those pairs in a direction parallel to the columns, the method comprising:
   providing a plurality of design constraints relevant to the design of the sampling and reference capacitors in the sample and hold circuit;
   determining an optimal form factor n using the plurality of design constraints, wherein n comprises the number of the plurality of pairs of sampling and reference capacitors vertically stacked over the plurality of array columns served by those pairs, wherein the optimal form factor yields a smallest column height of the vertically stacked pairs of sampling and reference capacitors in a direction parallel to the columns;
   using a computer to create layout data for the sampling and reference capacitors in accordance with the determined optimal form factor n and in accordance with the plurality of design constraints, wherein the layout data is used in the fabrication of masks used to fabricate the imager integrated circuit.

* * * * *